(12) United States Patent
Darcie et al.

(10) Patent No.: US 8,785,855 B2
(45) Date of Patent: Jul. 22, 2014

(54) INTERLACED TERAHERTZ TRANSCEIVER USING PLASMONIC RESONANCE

(71) Applicants: Thomas E. Darcie, Victoria (CA); Reuven Gordon, Victoria (CA); Barmak Heshmat, Victoria (CA)

(72) Inventors: Thomas E. Darcie, Victoria (CA); Reuven Gordon, Victoria (CA); Barmak Heshmat, Victoria (CA)

(73) Assignee: UVic Industry Partnerships Inc., Victoria (CA)

( * ) Notice: Subject to any disclaimer, the term of this patent is extended or adjusted under 35 U.S.C. 154(b) by 0 days.

(21) Appl. No.: 14/055,825

(22) Filed: Oct. 16, 2013

(65) Prior Publication Data

US 2014/0103211 A1    Apr. 17, 2014

Related U.S. Application Data

(60) Provisional application No. 61/714,626, filed on Oct. 16, 2012.

(51) Int. Cl.
*G01J 5/20* (2006.01)
*H01S 3/08* (2006.01)

(52) U.S. Cl.
USPC ..................... 250/338.4; 250/504 R

(58) Field of Classification Search
USPC ............ 250/338.4, 340, 341.1, 493.1, 504 R; 310/313 R; 359/254
See application file for complete search history.

(56) References Cited

U.S. PATENT DOCUMENTS

| | | | | |
|---|---|---|---|---|
| 5,945,720 | A * | 8/1999 | Itatani et al. | 257/432 |
| 6,034,809 | A * | 3/2000 | Anemogiannis | 359/254 |
| 8,118,156 | B2 * | 2/2012 | Kondoh | 198/619 |
| 2010/0206696 | A1 * | 8/2010 | Kondoh | 198/630 |
| 2010/0271692 | A1 * | 10/2010 | Hor et al. | 359/356 |
| 2011/0192996 | A1 * | 8/2011 | Hahn | 250/505.1 |
| 2012/0074323 | A1 * | 3/2012 | Gomez rivas et al. | 250/338.4 |

* cited by examiner

*Primary Examiner* — Mark R Gaworecki
(74) *Attorney, Agent, or Firm* — Klarquist Sparkman, LLP

(57) ABSTRACT

Disclosed are devices and methods for enhancing the performance of photoconductive switches or photomixers used to generate or receive terahertz radiation. An interlaced electrode is used to minimize carrier transit times across an absorbing semiconductor photoconductor. This electrode is designed to support a plasmonic resonance such that coupling of the optical pump signal to the absorbing photoconductor is enhanced.

13 Claims, 3 Drawing Sheets

INTERLACED TERAHERTZ TRANSCEIVER USING PLASMONIC RESONANCE

CROSS REFERENCE TO RELATED APPLICATION

This application claims the benefit of U.S. Provisional Application 61/714,626, filed Oct. 16, 2012, which is incorporated herein by reference.

FIELD

The invention pertains to terahertz systems for use in imaging, inspection, manufacturing, security and spectroscopy.

BACKGROUND

Research in terahertz (THz) imaging [1] and spectroscopy [2] has advanced significantly in the last decade, fueled particularly by advances in the output power of THz sources and the efficiency of THz detectors [3]. Photoconductive (PC) switching offers advantages over other methods of THz generation and detection [3]. In particular, PC switches are compact and low cost, they operate at room temperature, and they can function both as emitters and receivers of THz waves. These PC switches are most commonly incorporated in center-fed microantennas, usually fabricated on a semiconducting material that has a short carrier lifetime, such as low-temperature (LT) grown GaAs [3]. The feed current of the microantenna is provided by the short-lifetime photocarriers that are generated through optical excitation of the center gap of the antenna.

Research efforts have focused on improving the efficiency of PC switches for THz applications [1-3]. From the material perspective, low-mobility LT-GaAs replaced high-mobility GaAs due to shorter carrier lifetime more than a decade ago [3]. This allowed higher bandwidth operation and deeper carrier density modulation that was vital to access the hyper-THz (>1 THz) range and to obtain higher sensitivity. However, this was achieved at the price of lower carrier mobility. Since the efficiency and hence sensitivity is directly dependent on mobility [3, 4], numerous studies have been conducted to compensate for the low mobility in LT-GaAs using more complex materials such as GaBiAs and ion-implanted GaAs [3-7].

Separately from the antenna design there has been an effort to use interlaced structures [8] and nanostructures in the gap of the antenna to improve the efficiency. The size of the center gap of the antenna was conventionally defined by the optical excitation spot size and thermal conduction of the substrate. Conventional designs tend to converge to gap size of 4-6 μm. Recently, a submicron-sized gap was proposed and successfully implemented in the form of tip-to-tip nanogaps and nanoantennas [9-11]. Tip-to-tip nanogaps [10] provide high electric bias-field intensity, but due to their small scale they have low optical coupling efficiency. Most of the optical pump signal is reflected from the metallic conductive surface and does not contribute to generating current. Interlaced THz-emitting PC switches [8] on LT-GaAs, with gaps of a few microns, provide more efficient carrier collection, but again at the price of lower optical coupling and higher undesired dark current. Optical nano-antennas have been used in a center-fed bow-tie PC antenna [12]. The plasmonic resonance of the periodic array of nano-antennas helped to concentrate the optical pump signal within the gaps between the antenna elements, but the electrode spacing of several microns resulted in poor high-speed performance.

Hence there is a need to improve the efficiency of coupling an optical pump signal to the photo-absorbing semiconductor material while also achieving good high-frequency performance in nano-structured transceivers used in THz systems. Disclosed herein are PC switches that use a plasmonic resonance to efficiently couple light into gaps between electrodes of typically 100 nm that enable fast carrier transit time from a semiconducting substrate like GaAs for efficient high-speed THz detection.

DETAILED DESCRIPTION OF THE INVENTION

Nanoplasmonics involves the nanostructuring of metals to achieve an enhanced optical response and this has been used to improve the performance of detectors [13], light emitters [14], imaging systems [15], nanoantennas, [16] filters and waveguides [17]. A key property of nanoplasmonics is the capability to efficiently couple light into subwavelength structures [18, 19].

The present disclosure describes nanoplasmonic PC switches that use a plasmonic resonance to efficiently couple light into gaps of typically 100 nm, substantially smaller than the wavelength of the optical pump signal. The small gaps enable fast carrier sweep out or transit time from a semiconducting substrate like GaAs. The combination of efficient optical coupling and short transit time enables efficient THz generation or detection.

In spectroscopy the disclosed methods and apparatus can be used to study different properties of materials and chemicals, such as absorption, conductivity, refractive index, etc. and for differentiating cancerous tissues from healthy tissues, as well as in imaging applications such as imaging of biological and chemical samples.

Figure 1:
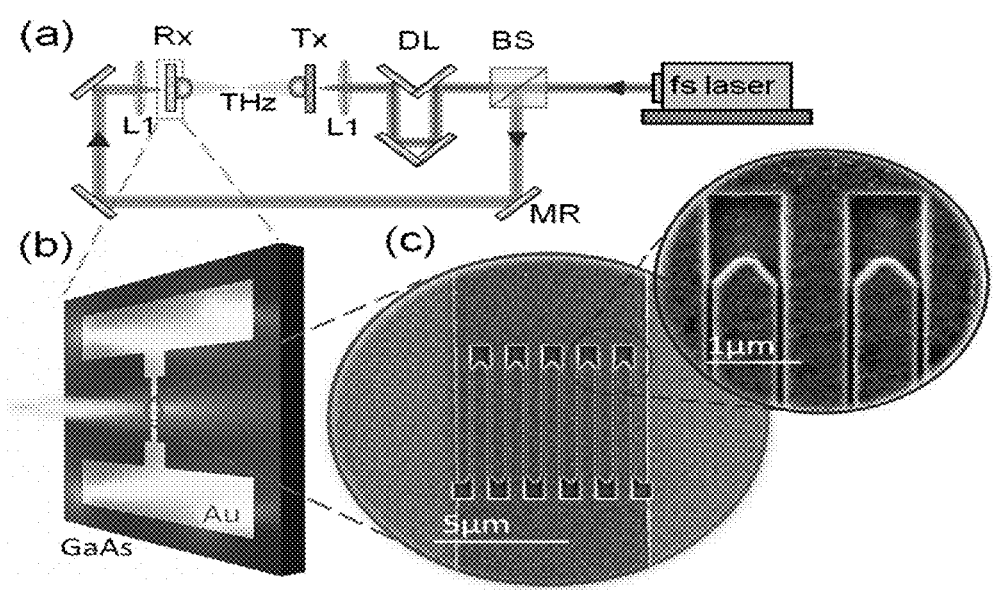
FIG. 1: (a) Schematic of the THz detection setup. Abbreviations used: MR=Mirror, BS=Beam splitter, DL=Delay line, L=Lens, Rx=THz receiving PC switch, Tx=THz transmitting PC switch, and fs laser=femtosecond Ti-Sapphire pulse laser. (b) 3D model of the plasmonic THz receiving PC switch. (c) SEM image of the interlaced structure. The gaps are 100 nm and the metallic fingers are 600 nm wide each. The inset shows further details of the structure.

A schematic of a representative THz heterodyne setup is shown in FIG. 1($a$). In this setup, part of an optical pump pulse is selected using a beamsplitter (BS) and focused by lens L1 onto a THz transmitter chip (Tx). The resulting THz pulse propagates through the Tx chip and is focused by a silicon lens into a test region or spectrometer. The phase of the THz pulse is varied with variations of the length of the optical excitation pulse path using a delay line (DL). At the receiver, the THz pulse is re-focused onto a receiver chip where the received signal is sampled by the remaining portion of the pump pulse to generate an electronic signal. The receiver is connected to a lock-in amplifier that detects the current signal as the delay (DL) is varied. This signal is then processed using well known techniques to yield the frequency-dependent absorption properties of the sample under test.

Some designs for THz receiving PC switches use a simple dipole antenna design with arms ranging in length from 10-100 μm. These antennas are driven by center PC gaps of width 5-10 μm fabricated on typically LT-GaAs substrates. In accordance with one embodiment of the present invention, this center gap is replaced with a nanoplasmonic interlaced structure with gaps of typically 100 nm (FIGS. 1(b), 1(c)), and a period designed to resonantly enhance optical pump coupling into the spaces between the conductive fingers.

Figure 2:
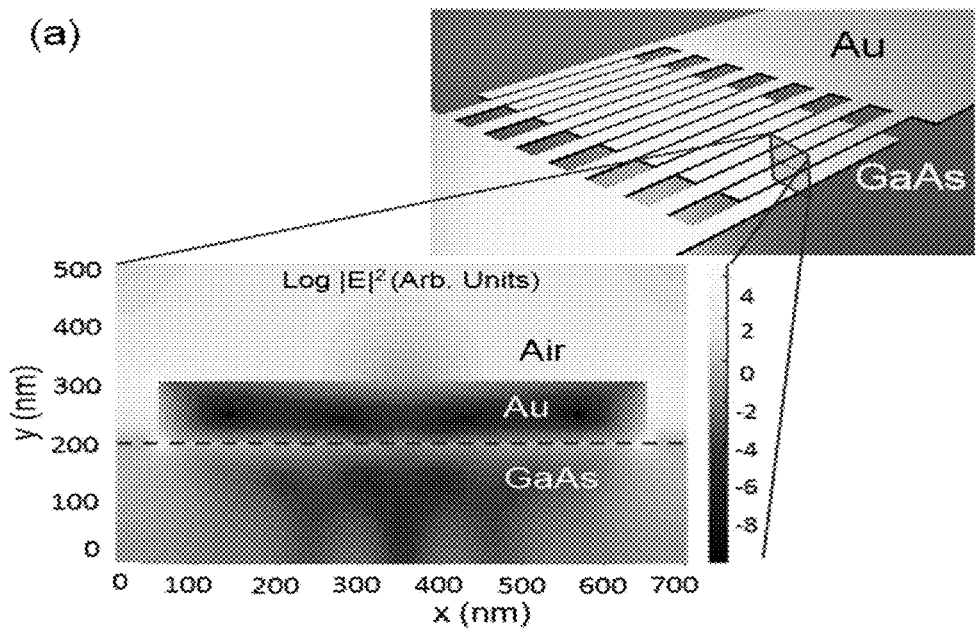
FIG. 2: FDTD simulation results. (a) 2D E-field profile (log ($|E|^2$)) of a single finger cross section. The structure is repeated with 700 nm periodicity for ten periods in the gap (FIG. 1($c$)). (b) The electric field loss spectrum in 200 nm depth of the substrate.
Figure 2:
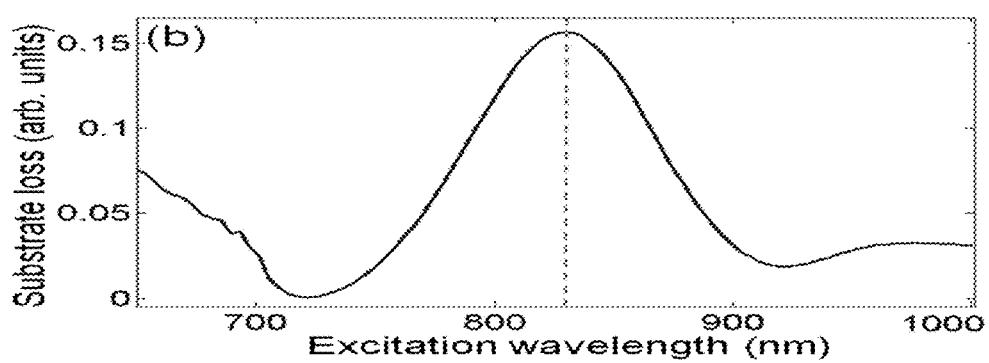

To design an interlaced structure that is resonant with the incident beam, we used computer simulations (FDTD Lumerical software, mesh accuracy 1 nm×1 nm) and searched for the extra-ordinary optical transmission (EOT) peak with finger and gap width variations. FIG. 2(a) shows the electric field 2D profile of a single gold finger, in a periodic structure with period of 700 nm which results in 100 nm gaps between the fingers (FIG. 1(c)). As seen in FIG. 2(b), the structure shows a peak in the substrate E-field loss at excitation wavelength of 830 nm. This peak in loss means that in the given geometry the light penetrates into substrate much more efficiently relative to other geometries. 830 nm is the center wavelength of the excitation pulse generated by a Ti-Sapphire femtosecond pump laser (i.e. pulse width=30 fs and 80 MHz repetition rate). The electric field loss in 200 nm depth of substrate (y axis) is used as a criterion of transmission of each frequency through the interlaced electrode structure.

To demonstrate one embodiment of this invention, we fabricated the device shown in FIG. 1 on a semi-insulating GaAs wafer ([100] orientation, 350 μm thickness, ~1.3×10$^8$ ohm·cm resistivity and ~5500 cm$^2$/V.s mobility). The carrier lifetime exceeds 200 ps for bulk GaAs substrates, as confirmed by reflective pump-probe measurements. For the first step of fabrication, a closed-gap structure is fabricated by photolithography (95 nm Au with a 5 nm Cr adhesive layer). The closed gap is then sputtered using a focused ion beam machine (Hitachi FB-2100 Focused Ion Beam system). The interlaced structure is connected to gold electrodes which are connected to larger gold pads. The gold pads facilitate biasing and measurement of the signal from the structure (FIG. 1(b)).

To compare the performance of the interlaced structure as a THz receiver, we also fabricated a conventional 20 μm dipole with 5 μm center gap on the same GaAs substrate. Additionally, we fabricated the same dipole structure on an LT-GaAs substrate (1 μm LT-GaAs grown at 250° C., in-situ MBE annealing at 600° C. for 60 second, 0.5% excess As), as is typical in the prior art. A commercial LT-GaAs PC switch (BATOP PCA-800 nm) was used as the THz transmitter. The signal is first measured with another similar commercial PC switch at the receiver side (10 μm dipole with 5 μm center gap with back-mounted silicon lens and substrate antireflection coating).

Figure 3:
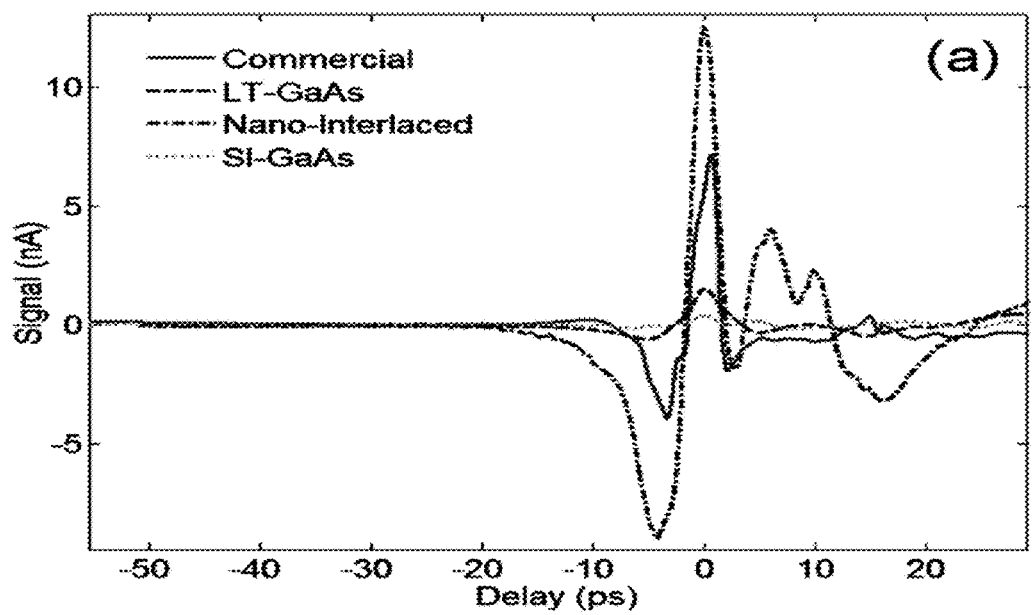
FIG. 3: (a) The same THz pulse is measured with: plasmonic interlaced structure on GaAs (peak to peak 20.5 nA), commercial PC switch (peak to peak 10 nA), dipole on LT-GaAs (peak to peak 2 nA), and dipole on GaAs (peak to peak 0.5 nA). (b) Signal spectrum in dB. Noise level is −80 dB.
Figure 3:
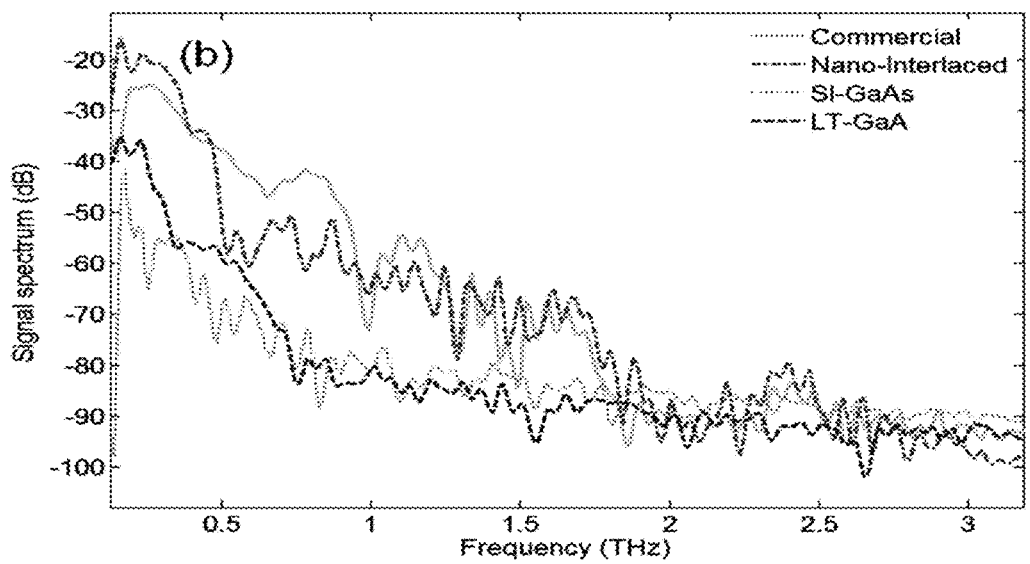

In order to correctly illuminate the center gap, the receiver is biased first to maximize the photocurrent measured in the THz receiving PC switch. After optical alignment, the receiver is connected to the lock-in amplifier and the silicon lens at the back of the receiver (FIG. 1(a)) is aligned for maximum signal. Results for the commercial receiver are shown in FIG. 3(a). The pulse has sharp sub-picosecond features that translate into THz frequency components in the frequency domain (FIG. 3(b)). The receiver PC switch is then replaced with our PC switches and the results are measured again. For each measurement the silicon lens is aligned to obtain the maximum signal. As it is seen in FIG. 3(b) the ordinary dipole on GaAs has lower bandwidth. The positive and negative peaks of the detected pulse depend on the photocarrier rise time and fall time respectively [19]. The rise time in GaAs is similar to that of LT-GaAs and therefore the GaAs PC switch can detect the positive side of the THz pulse. However, due to long photocarrier fall time, the negative peak of the pulse is not captured completely and the results are relatively low in frequency and amplitude. The short photocarrier fall time in LT-GaAs enables the PC switch to capture both positive and negative peaks and this enhances the bandwidth and sensitivity of the device as seen in FIG. 3. The commercial device shows better performance compared to our conventional (not nanoplasmonic) dipole on LT-GaAs due to antireflection coating which enhances the optical coupling to its gap by roughly 30%. The nanoplasmonic PC switch shows superior performance compared to the other devices. As seen in FIG. 3, the detected signal in the plasmonic PC switch is double that of commercial device on LT-GaAs, one order of magnitude higher than our LT-GaAs PC switch, and around 40 times more than that of ordinary 5 μm dipole on GaAs.

There are two mechanisms that result in the enhanced response for GaAs. First, higher detection bandwidth is obtained due to short carrier sweep-out time which causes deeper photocarrier density modulations. Second, there is an active region adjacent to each electrode that defines the number of photocarriers that are collected. This active region is equivalent to the photocarrier lifetime multiplied by saturation velocity. For LT-GaAs with approximately 0.8 ps carrier lifetime and $1.3×10^7$ cm/s electron saturation velocity [20] the active distance from the electrodes is around 100 nm. This implies that photocarriers that are generated further than 100 nm from the edge of the electrodes are on average more likely to recombine before reaching the electrodes. On the other hand for GaAs with more than 200 ps carrier lifetime, the photocarriers are yet present long after the THz field is gone. This results in reduced bandwidth and blurring of the sharp peaks in the detected signal. Transit time across the 100 nm gap between the fingers in the interlaced structure is much shorter than their original lifetime. Based on GaAs electron saturation velocity, the 100 nm gap size is just about the right size to artificially mimic the 0.8 ps carrier lifetime of the LT-GaAs.

Nanoplasmonic resonances in the slits lead to high total optical transmission that increases the efficiency. The 100 nm gap size also increases the THz field intensity across the gap and this increases the detected current. Secondary peaks appear approximately 6 ps after the main peak in the detected signal, corresponding to the roundtrip time of the THz wave internal reflections inside the 350 μm thick GaAs wafer.

To confirm the presence of nanoplasmonic resonances, we measured the reflection of the interlaced structure for two different optical excitation polarizations ($R_\perp$; the reflection when the polarization is perpendicular to the slits and $R_\parallel$; the reflection when the E-field polarization is parallel with the slits). We then compared the results with FDTD simulation results. Based on the simulations the ratio $R_\parallel/R_\perp$ was found to be 2.6. This ratio was measured to be 2.1 for our fabricated interlaced structure. The measured high polarization dependent transmission indicates resonant transmission. The mismatch between the theory and measurement can be due to surface roughness that is induced in FIB process. The roughness in the gold surface can induce scattering that weakens the effect [21].

A new type of photoconductive switch for use in terahertz systems has been proposed and demonstrated. The embodiment described above proves the efficacy of combining plasmonic resonant transmission of the optical pump with nanostructured electrode design. In addition to this design, numerous other embodiments can be contemplated, some of which are obvious to one skilled in the art. For example, while the demonstrated device used a substrate of GaAs, a wide variety of semiconductor materials could be used. A wide variety of antenna configurations has also been demonstrated in scientific literature and in available products. These are entirely compatible with the present invention. In addition, recent activity has targeted terahertz systems in which terahertz radiation is launched directly into waveguide structures rather than being radiated from an antenna. Our photoconductive switch could be used to drive such waveguide systems directly. Also, our discussion above this focused on time-domain terahertz systems where short pulses are converted to terahertz radiation using photoconductive switches. Our approach is also applicable to frequency-domain systems in which two continuous-wave lasers offset in frequency are mixed together on a photomixer to produce a continuous-wave terahertz signal. For the purposes of this invention, the term photomixer is synonymous with the term photoconductive switch. Finally, we have described in detail one specific electrode configuration. It is understood that any electrode configuration designed to induce the plasmonic resonant enhancement while minimizing carrier transit time is within the scope of this invention. The disclosure is directed to various novel and unobvious features and combinations of features such as:

1. use of a cost effective material (e.g. GaAs) for sensitive THz reception and detection.
2. plasmonic resonant electrode structures that increase transmission of an optical excitation pulse.
3. enhancement of a THz field using a sub-wavelength electrode gap.
4. faster response from long carrier lifetime semiconductors like GaAs through use of sub-wavelength (e.g. 100 nm) gap sizes.

REFERENCES

The following references are cited in the disclosure. Each of these references is incorporated herein by reference in its entirety.

(1) Lee, W. M.; and Hu, Q., *Opt. Lett.*, 2005, 30, 2563.
(2) Tonouchi, M., *Nat. Phot.*, 2007, 1, 97.
(3) Dragoman, T. D.; Dragoman, M., *Prog. in Q. Elec.*, 2004, 28, 1-66.
(4) Allam J., U.S. Pat. No. 4,998,154, MSM photodetector with superlattice, Mar. 5, 1991.
(5) Heshmat, B.; Pahlevaninezhad, H.; Beard, M. C.; Papadopoulos, C.; and Darcie, T. E., *Opt. Exp.*, 2011, 19, 15077-15089.
(6) Bertulis, K.; Krotkus, A.; Aleksejenko, G.; Pačebutas, V.; Adomavičius, R.; and Molis, G., *App. Phys. Lett.*, 2006, 88, 201112.
(7) Tan, H.; Jagadish, C.; Korona, K.; Jasinski, J.; Kaminska, M.; Viselga, R.; Marcinkevicius, S.; and Krotkus, A., *IEEE J. of Sel. Top. in Q. Eelec.*, 1996, 2, 66.
(8) Chen, Y.; Williamson, S.; Brock, T.; Smith, F. W.; and Calawa, A. R., *Appl. Phys. Lett.*, 1991, 59, 1984.
(9) Park, S.; Jin, K.; Yi, M.; Ye, C. J.; Ahn, J.; and Jeong, K., *Nano Lett.*, 2012, 6, 2026-2031.
(10) Tanoto, H.; Teng, J. H.; Wu, Q. Y.; Sun, M.; Chen, Z. N.; Maier, S. A.; Wang, B.; Chum, C. C.; Si, G. Y.; Danner, A. J.; and Chua, S. J., *Nat. Phot.*, 2012, 6, 121-126.
(11) Park, H. R.; Bahk, Y.; Ahn, K.; Park, Q.; Kim, D. S.; Moreno, L.; Vidal, F. J.; and Abad, J. B., *ACS Nano*, 2011, 5, 8340.
(12) Park, S. G.; Jin, K. H.; Yi, M.; Ye, J. C.; Ahn, J.; and Jeong. K., *ACS Nano*, 2012, 6, 2026.
(13) Gravrand, O; Destefanis, G.; Le Perchec; J., U.S. Pat. No. 955,659, Photodetector with a plasmonic structure, Nov. 29, 2010.
(14) Ebbesen; W. T., Ghaemi; H. F., Peter; T. T., Wolff; A., U.S. Pat. No. 5,973,316, Sub-wavelength aperture arrays with enhanced light transmission, Oct. 26, 1999.
(15) Itatani; T., Matsumoto; K., Ishii; M., Nakagawa; T., Sugiyama; Y., U.S. Pat. No. 5,945,720, Photo-receiving device with light guide, Aug. 31, 1999.
(16) Hahn; J. W., US 2011/0192996 A1, A contact type plasmonic nano optical probe, Dec. 6, 2010.
(17) Arend; M., Crouse; D., U.S. Pat. No. 6,034,809, Optical plasmon-wave structures, Mar. 7, 2000.
(18) Lee, B., Choi, B., U.S. Ser. No. 07/26069, Tunable plasmonic filter, Dec. 21, 2007.
(19) Sun, F. G.; Wagoner, G. A.; and Zhang, X.-C., *Appl. Phys. Lett.*, 1995, 67, 1656-1658.
(20) Hsin, Y. M.; Tang, W. B.; Hsu, H. T.; *Solid-State Elec.*, 2003, 49, 295-300.
(21) Cai, W.; and Brongersma, M. L., *Nat. Nanotech.*, 2010, 5, 485-486.

The invention claimed is:

1. A photoconductive switch for generating or detecting electromagnetic signals using an optical pump signal, comprising:
   a periodically interlaced electrode structure, wherein a gap separating two electrode contacts is substantially less than a wavelength of the optical pump signal; and
   wherein the periodicity of the interlaced electrode structure supports a plasmonic resonance that enhances coupling of the optical pump signal through the electrode structure to an absorbing semiconductor substrate.

2. The photoconductive switch of claim 1, wherein the interlaced electrode structure provides a carrier transit time that is substantially shorter than a carrier recombination time.

3. The photoconductive switch of claim 1, wherein the periodicity of the interlaced electrode structure is selected such that the plasmonic resonance frequency corresponds to the frequency of the optical pump signal.

4. The photoconductive switch of claim 1, wherein the interlaced electrode structure is formed by conductive fingers alternating in connection between each of the two electrode contacts.

5. The photoconductive switch of claim 1, wherein the interlaced electrode structure is formed by at least one sub-wavelength gap that meanders back and forth between each of two electrode contacts.

6. The photoconductive switch of claim 1, wherein the electromagnetic signals contain frequency components within a terahertz band extending from 0.1 THz to 10 THz.

7. A method for generating and detecting electromagnetic signals, comprising:
   detecting an optical pump signal on a photoconductive switch, the switch comprising a periodically interlaced electrode structure wherein the gap separating two conductors is substantially less than the wavelength of the optical pump signal; and
   wherein the periodicity of the interlaced electrode structure supports a plasmonic resonance at a frequency corresponding to the frequency of the optical pump signal.

8. A THz transmitter for generating electromagnetic signals, comprising:
   a photoconductive switch, comprising:

a periodically interlaced electrode structure, wherein a gap separating two electrode contacts is substantially less than a wavelength of an optical pump signal;

wherein the periodicity of the interlaced electrode structure supports a plasmonic resonance that enhances coupling of the optical pump signal through the electrode structure to an absorbing semiconductor substrate.

9. The THz transmitter of claim 8, further comprising an antenna coupled to the photoconductive switch, and configured to radiate THz radiation when fed by currents generated by the photoconductive switch in response to the optical pump signal.

10. The THz transmitter of claim 8, further comprising a waveguide coupled to receive a THz signal from the photoconductive switch generated in response to the optical pump signal.

11. A receiver for detecting THz electromagnetic signals, comprising:

a photoconductive switch that generates a detected signal in response to an optical pump signal, the photoconductive switch comprising:

a periodically interlaced electrode structure, wherein a gap separating two electrode contacts is substantially less than a wavelength of an optical pump signal, wherein the periodicity of the interlaced electrode structure supports a plasmonic resonance that enhances coupling of the optical pump signal through the electrode structure to an absorbing semiconductor substrate.

12. The receiver of claim 11, further comprising an antenna coupled to deliver received THz radiation to the photoconductive switch.

13. The receiver of claim 11, further comprising a waveguide coupled to deliver received THz radiation to the photoconductive switch.

\* \* \* \* \*